(12) United States Patent
Khlat

(10) Patent No.: US 11,336,240 B2
(45) Date of Patent: May 17, 2022

(54) UPLINK MULTIPLE INPUT-MULTIPLE OUTPUT (MIMO) TRANSMITTER APPARATUS USING TRANSMIT DIVERSITY

(71) Applicant: Qorvo US, Inc., Greensboro, NC (US)

(72) Inventor: Nadim Khlat, Cugnaux (FR)

(73) Assignee: QORVO US, INC., Greensboro, NC (US)

(*) Notice: Subject to any disclaimer, the term of this patent is extended or adjusted under 35 U.S.C. 154(b) by 0 days.

(21) Appl. No.: 17/149,917

(22) Filed: Jan. 15, 2021

(65) Prior Publication Data

US 2021/0226593 A1 Jul. 22, 2021

Related U.S. Application Data

(60) Provisional application No. 62/961,735, filed on Jan. 16, 2020.

(51) Int. Cl.
| | |
|---|---|
| *H03F 3/24* | (2006.01) |
| *H03F 3/213* | (2006.01) |
| *H04B 7/0413* | (2017.01) |
| *H04B 7/155* | (2006.01) |
| *H03F 1/02* | (2006.01) |

(52) U.S. Cl.
CPC ............ *H03F 3/24* (2013.01); *H03F 1/0222* (2013.01); *H03F 3/213* (2013.01); *H04B 7/0413* (2013.01); *H04B 7/15542* (2013.01); *H03F 2200/451* (2013.01)

(58) Field of Classification Search
CPC .......... H03F 3/24; H03F 1/0222; H03F 3/213; H03F 2200/451; H04B 7/0413; H04B 7/15542
See application file for complete search history.

(56) References Cited

U.S. PATENT DOCUMENTS

| | | | |
|---|---|---|---|
| 10,177,830 B2* | 1/2019 | Maehata | ................ H04L 25/49 |
| 2004/0266365 A1* | 12/2004 | Hasson | ................ H04L 27/368 |
| | | | 455/91 |
| 2005/0148307 A1 | 7/2005 | Zipper | |

(Continued)

OTHER PUBLICATIONS

Non-Final Office Action for U.S. Appl. No. 17/154,394, dated Aug. 4, 2021, 19 pages.

(Continued)

*Primary Examiner* — Nguyen T Vo
(74) *Attorney, Agent, or Firm* — Withrow & Terranova, P.L.L.C.

(57) ABSTRACT

An uplink multiple input-multiple output (MIMO) transmitter apparatus using transmit diversity uses transmit diversity signals that are modified to create intermediate orthogonal signals. A transceiver circuit in the transmitter apparatus includes a sigma-delta circuit that creates a summed (sigma) signal and a difference (delta) signal from the intermediate orthogonal signals. These new sigma and delta signals are amplified by power amplifiers to a desired output level before having two signals reconstructed from the amplified sigma and amplified delta signals by a second circuit. These reconstructed signals correspond to the two original transmit diversity signals but are at a desired amplified level relative to the two original signals. The reconstructed signals are then transmitted through respective antennas as uplink signals.

17 Claims, 6 Drawing Sheets

(56) References Cited

U.S. PATENT DOCUMENTS

| | | |
|---|---|---|
| 2006/0077075 A1 | 4/2006 | Immink et al. |
| 2008/0037662 A1* | 2/2008 | Ravi ................ H03F 3/217 |
| | | 375/260 |
| 2008/0187035 A1 | 8/2008 | Nakamura et al. |
| 2010/0182090 A1 | 7/2010 | Yang et al. |
| 2014/0340160 A1 | 11/2014 | Kuroda |
| 2016/0336973 A1* | 11/2016 | Aono ................ H04B 1/04 |
| 2018/0145700 A1 | 5/2018 | Yu et al. |
| 2020/0295790 A1 | 9/2020 | Langer et al. |
| 2020/0382066 A1 | 12/2020 | Khlat |
| 2020/0403661 A1 | 12/2020 | Khlat |

OTHER PUBLICATIONS

Applicant-Initiated Interview Summary for U.S. Appl. No. 17/154,394, dated Oct. 13, 2021, 3 pages.
Final Office Action for U.S. Appl. No. 17/154,394, dated Dec. 21, 2021, 13 pages.
Non-Final Office Action for U.S. Appl. No. 17/144,825, dated Mar. 29, 2022, 7 pages.

\* cited by examiner

UPLINK MULTIPLE INPUT-MULTIPLE OUTPUT (MIMO) TRANSMITTER APPARATUS USING TRANSMIT DIVERSITY

RELATED APPLICATIONS

This application claims the benefit of U.S. provisional patent application Ser. No. 62/961,735, filed Jan. 16, 2020, the disclosure of which is hereby incorporated herein by reference in its entirety.

FIELD OF THE DISCLOSURE

The technology of the disclosure relates generally to a radio frequency (RF) transmitter.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as Wi-Fi, long-term evolution (LTE), and fifth-generation new-radio (5G-NR). To achieve the higher data rates in mobile communication devices, sophisticated power amplifiers may be employed to increase output power of radio frequency (RF) signals (e.g., maintaining sufficient energy per bit) communicated by mobile communication devices. However, the increased output power of RF signals can lead to increased power consumption and thermal dissipation in mobile communication devices, thus compromising overall performance and user experiences.

5G-NR, in particular, relies on multiple input-multiple output (MIMO) techniques to enable high-bandwidth communication where plural antennas and transceiver chains may transmit different data signals concurrently. Traditional MIMO techniques typically use a separate power amplifier for each transceiver chain. These power amplifiers may be bulky to handle required power levels, which can lead to increased footprint, power consumption, and costs. Hence, there may be room for improvement in providing power amplification to MIMO circuits.

SUMMARY

Embodiments of the disclosure relate to an uplink multiple input-multiple output (MIMO) transmitter apparatus using transmit diversity. In a non-limiting example, transmit diversity signals are modified to create intermediate orthogonal signals. A transceiver circuit in the transmitter apparatus includes a sigma-delta circuit that creates a summed (sigma) signal and a difference (delta) signal from the intermediate orthogonal signals. These new sigma and delta signals are amplified by power amplifiers to a desired output level before having two signals reconstructed from the amplified sigma and amplified delta signals by a second circuit. These reconstructed signals correspond to the two original transmit diversity signals but are at a desired amplified level relative to the two original signals. The reconstructed signals are then transmitted through respective antennas as uplink signals. By employing this uplink MIMO transmitter apparatus, it is possible to use smaller power amplifiers, which may reduce footprint, power consumption, and costs of the uplink MIMO transmitter apparatus. Likewise, a single modulated voltage signal may be used to control the power amplifiers.

In one aspect, a transmitter apparatus is disclosed. The transmitter apparatus comprises a transceiver circuit. The transceiver circuit comprises a phase-shifting circuit configured to shift a first signal by ninety degrees to create a second signal orthogonal to the first signal. The transceiver circuit also comprises a first sigma-delta network. The first sigma-delta network comprises an input configured to receive the first signal and the second signal. The first sigma-delta network also comprises first summation circuitry configured to sum the first signal with the second signal to create a sigma signal. The first sigma-delta network also comprises first difference circuitry configured to subtract the second signal from the first signal to create a delta signal. The first sigma-delta network also comprises a sigma output coupled to the first summation circuitry. The first sigma-delta network also comprises a delta output coupled to the first difference circuitry. The transmitter apparatus also comprises a first power amplifier coupled to the sigma output. The first power amplifier comprises a summed output. The transmitter apparatus also comprises a second power amplifier coupled to the delta output. The second power amplifier comprises a difference output.

In another aspect, a transmitter apparatus is disclosed. The transmitter apparatus comprises a first transceiver circuit. The first transceiver circuit comprises a first phase-shifting circuit configured to shift a first signal by ninety degrees to create a second signal orthogonal to the first signal. The first transceiver circuit also comprises a first sigma-delta network. The first sigma-delta network comprises an input configured to receive the first signal and the second signal. The first sigma-delta network also comprises first summation circuitry configured to sum the first signal with the second signal to create a sigma signal. The first sigma-delta network also comprises first difference circuitry configured to subtract the second signal from the first signal to create a delta signal. The first sigma-delta network also comprises a first sigma output coupled to the first summation circuitry. The first sigma-delta network also comprises a first delta output coupled to the first difference circuitry. The transmitter apparatus also comprises a first power amplifier coupled to the first sigma output. The first power amplifier comprises a first summed output. The transmitter apparatus also comprises a second power amplifier coupled to the first delta output. The second power amplifier comprises a first difference output. The transmitter apparatus also comprises a second transceiver circuit. The second transceiver circuit comprises a second phase-shifting circuit configured to shift a third signal by ninety degrees to create a fourth signal orthogonal to the third signal. The second transceiver circuit also comprises a second sigma-delta network. The second sigma-delta network comprises a second input configured to receive the third signal and the fourth signal. The second sigma-delta network also comprises second summation circuitry configured to sum the third signal with the fourth signal to create a second sigma signal. The second sigma-delta network also comprises second difference circuitry configured to subtract the fourth signal from the third signal to create a second delta signal. The second sigma-delta network also comprises a second sigma output coupled to the second summation circuitry. The second sigma-delta network also comprises a second delta output coupled to the second difference circuitry. The transmitter apparatus also comprises a third power amplifier coupled to the second sigma output. The third power amplifier comprises a second summed output. The transmitter apparatus also comprises a fourth power amplifier coupled to the second delta output. The fourth power amplifier comprises a second difference output.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
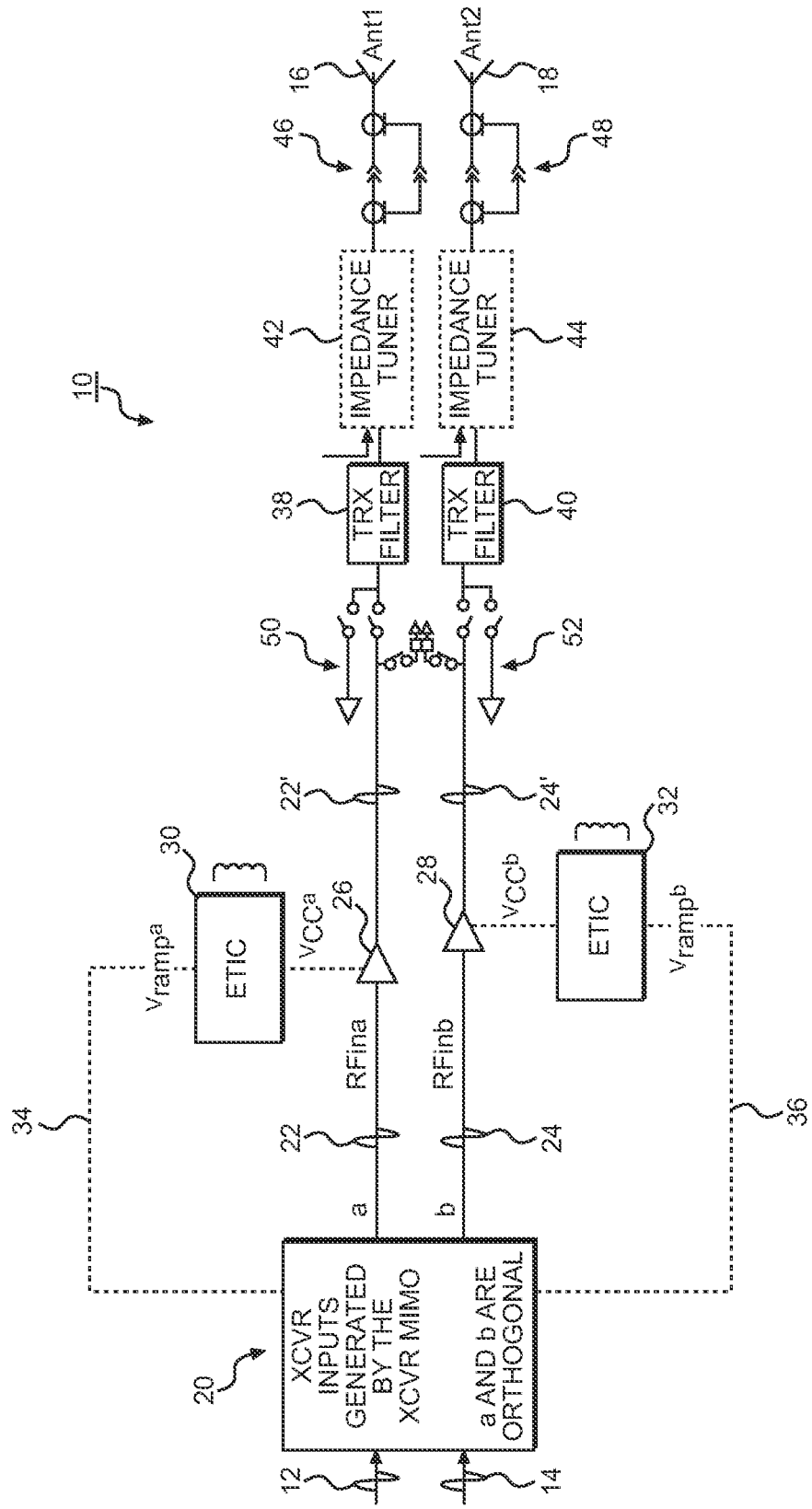
FIG. 1 is a schematic diagram of an exemplary conventional multiple input-multiple output (MIMO) transmitter apparatus configured to amplify a pair of input signals for concurrent transmission from a pair of antennas.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to an uplink multiple input-multiple output (MIMO) transmitter apparatus using transmit diversity. In a non-limiting example, transmit diversity signals are modified to create intermediate orthogonal signals. A transceiver circuit in the transmitter apparatus includes a sigma-delta circuit that creates a summed (sigma) signal and a difference (delta) signal from the intermediate orthogonal signals. These new sigma and delta signals are amplified by power amplifiers to a desired output level before having two signals reconstructed from the amplified sigma and amplified delta signals by a second circuit. These reconstructed signals correspond to the two original transmit diversity signals but are at a desired amplified level relative to the two original signals. The reconstructed signals are then transmitted through respective antennas as uplink signals. By employing this uplink MIMO transmitter apparatus, it is possible to use smaller power amplifiers, which may reduce footprint, power consumption, and costs of the uplink MIMO transmitter apparatus. Likewise, a single modulated voltage signal may be used to control the power amplifiers.

Figure 2:
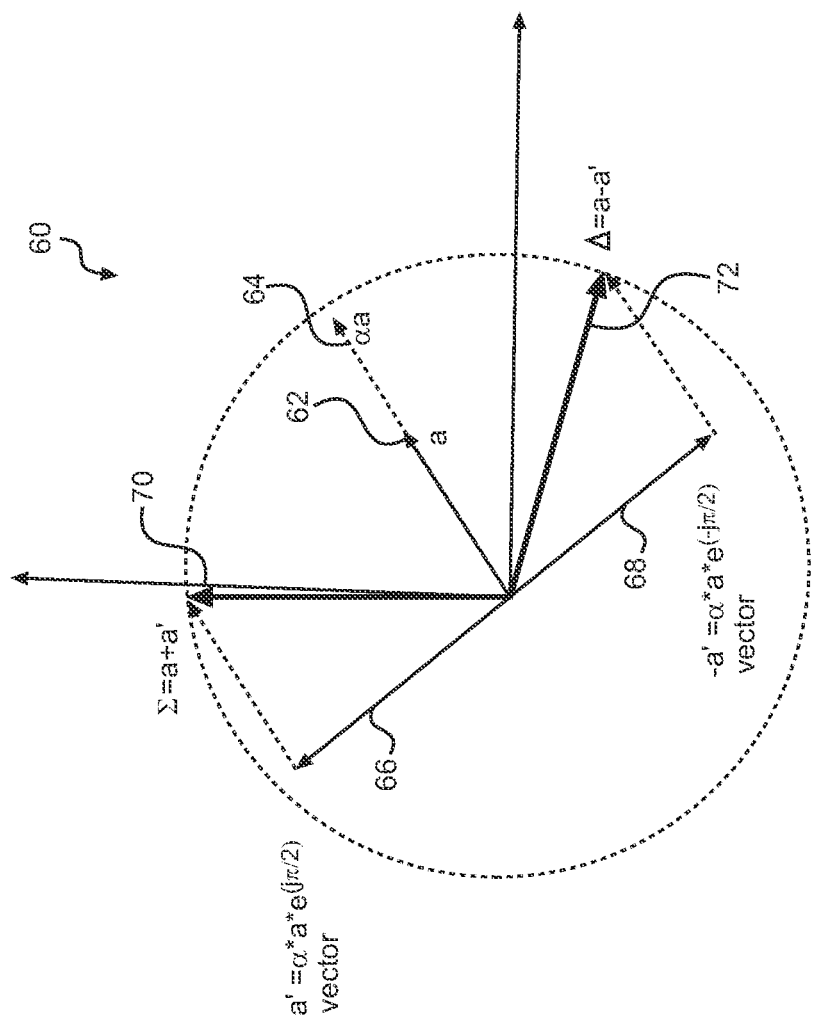
FIG. 2 is a vector diagram showing an original signal as well as its diversity signal aa along with proposed sum (sigma) and difference (delta) signals that may be created and used according to exemplary aspects of the present disclosure.
Figure 3:
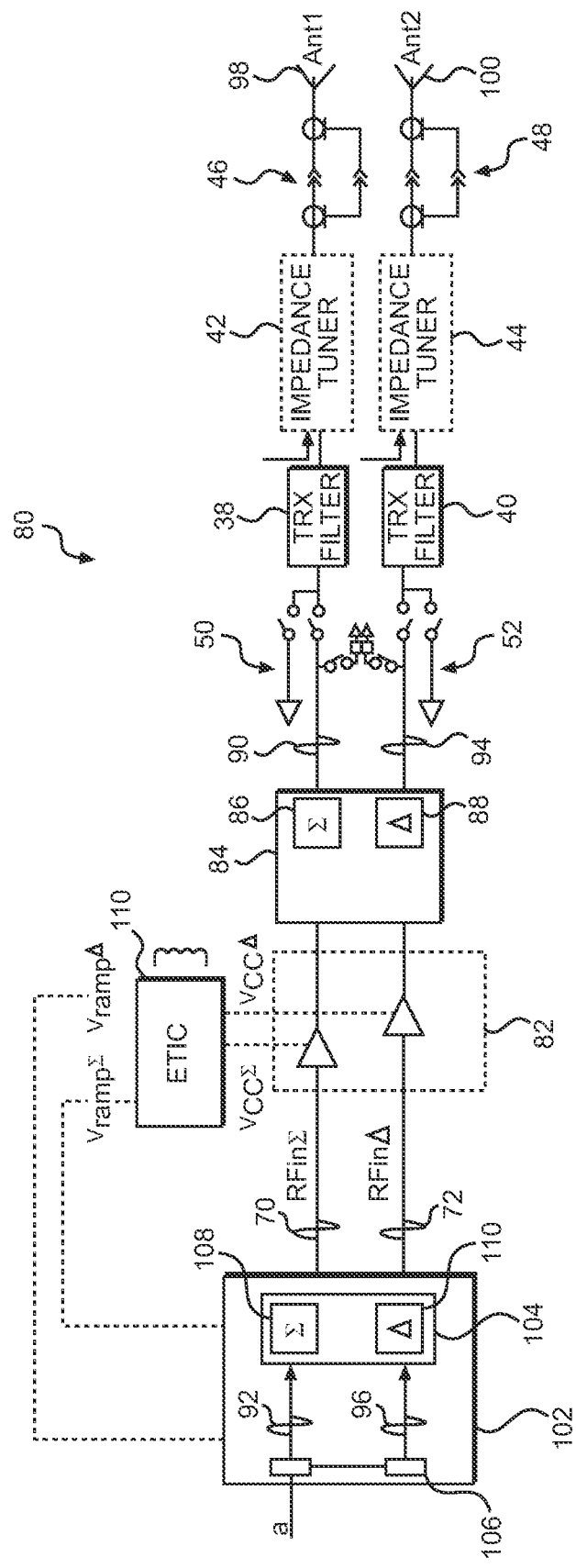
FIG. 3 is a schematic diagram of an exemplary MIMO transmitter apparatus configured according to an embodiment of the present disclosure to create sum (sigma) and difference (delta) signals within a transceiver circuit.

Before discussing a transmitter apparatus of the present disclosure, starting at FIG. 3, a brief overview of a conventional transmitter apparatus is first provided with reference to FIG. 1 to help understand the challenges associated with amplifying multiple RF signals. FIG. 2 provides a vector representation of how transmit diversity signals are handled by the transmitter apparatus of the present disclosure. Discussion of the details about the ETIC for use with the present disclosure begins below with reference to FIG. 5.

In this regard, FIG. 1 is a schematic diagram of an exemplary conventional transmitter apparatus 10 configured to amplify a first input signal 12 and a second input signal 14 for concurrent transmission from a first antenna 16 and a second antenna 18, respectively. For the purposes of the discussion of the present disclosure, the transmitter apparatus 10 is operating in a transmit diversity mode, meaning that the signals 12 and 14 are the same in content. Transmission at the antennas 16 and 18 provides spatial diversity to improve signal reception at the intended receiver.

The conventional transmitter apparatus 10 includes a transceiver circuit 20 configured to receive the first input signal 12 and the second input signal 14. The transceiver circuit 20 is configured to generate a first radio frequency (RF) signal 22, sometimes referred to as signal a or RFina, from the first input signal 12 and a second RF signal 24, sometimes referred to as signal b or RFinb, from the second input signal 14. Again, in a transmit diversity mode, the content of the signals 22 and 24 is identical, although they may be at different power levels leaving the transceiver circuit 20.

The conventional transmitter apparatus 10 includes two (2) power amplifier circuits 26 and 28 to amplify the first RF signal 22 and the second RF signal 24, respectively. The two power amplifier circuits 26 and 28 are controlled by envelope tracking integrated circuits (ETICs) 30 and 32, respectively to provide signals 22' and 24', which as noted, remain identical in content, but are at different power levels. The differing power levels may compensate for differing propagation path losses between the antennas 16 and 18 and the intended receiver. The ETICs 30 and 32 are controlled by Vrampa signal 34 and Vrampb signal 36 from the transceiver circuit 20. Control and use of the ETICs 30 and 32 is prevalent in the industry and not central to the present disclosure so further discussion is omitted. However, the interested reader is directed to U.S. Patent Application Publication No. 2020/0382066 for further information.

After amplification, the signals 22' and 24' are provided to respective filters 38 and 40. The filters 38 and 40 are coupled to impedance tuners 42 and 44, respectively. The impedance tuners 42 and 44 are coupled to the antennas 16 and 18, respectively, such as through a coaxial or flex line connection (noted at 46 and 48, respectively). In some instances (not usually present in a transmit diversity mode, but possible in other modes), there may be no signal being provided to an antenna. In such instances, the line with no signal may be terminated to a known voltage level (e.g., to ground). Accordingly, termination structures 50 and 52 are provided to provide such terminations.

There are three typical scenarios for use of the conventional transmitter apparatus 10. A first use case occurs when one signal (e.g., signal 22 or signal 24) is active at full power and the other signal is dormant or inactive. As noted above, this situation is not necessarily common in a transmit diversity mode, but may occur regularly in other modes. To handle this power requirement, the power amplifier circuits 26 and 28 are sized sufficiently large that they can produce the peak power. A second use case occurs when the signals 22 and 24 are equal and each is one-half the peak power such that the sum of the two amplified signals is equal to the peak power. Again, this situation may not occur frequently in transmit diversity, but is possible. As the power amplifier circuits 26 and 28 are sized to handle peak power, the power amplifier circuits 26 and 28 can produce the two half-peak power signals. A third use case occurs when the signals 22 and 24 are unequal, but cumulatively are less than or equal to the peak power. This situation is the most common in a transmit diversity mode. Despite this situation being the most common, there is no ready prediction which signal will be larger and thus would require the larger power amplifier. So, both power amplifier circuits 26 and 28 are sized to handle peak power.

Because of the need to handle peak power for either signal, each of the power amplifier circuits 26 and 28 is sized to produce such peak power and may occupy a relatively large footprint, consume power, and cost more than smaller power amplifiers. Further, having the two ETICs 30 and 32 likewise occupies a relatively large footprint, consumes power, and incurs a component cost. Hence, it is desirable to change the structure of the power amplifier circuits 26 and 28 as well as eliminate one of the ETICs 30 and 32 to help reduce footprint, power consumption, and cost. Given the likely requirement in a transmit diversity mode that the power amplifier circuits 26 and 28 would amplify to different levels, different Vcca and Vccb are generally required and any elimination of an ETIC 30 or 32 should provide a solution to these different output power level requirements.

Exemplary aspects of the present disclosure provide a solution to these concerns by initially transforming the transmit diversity signals into orthogonal signals as illustrated in FIG. 2. Specifically, FIG. 2 provides a vector representation 60 of a first signal 62, sometimes referred to as signal a (analogous to signal 22) and a second signal 64, sometimes referred to as signal aa (analogous to signal 24). As is readily apparent, the first signal 62 and the second signal 64 are identical except in magnitude, differing by a factor α. As such, the first signal 62 and the second signal 64 are not orthogonal. However, new intermediate signal 66 (sometimes referred to as a') and signal 68 (sometimes referred to as −a') may be created by phase shifting the second signal 64 by ±90°. Thus:

$$a' = \alpha a e^{(j\pi/2)} \qquad \text{Eq. 1}$$

and $$-a' = \alpha a e^{(-j\pi/2)} \qquad \text{Eq. 2}$$

By phase shifting in this manner, the first signal 62 is now orthogonal to the intermediate signals 66 and 68. Exemplary aspects of the present disclosure create a summed (sigma) signal 70 from the intermediate signal 66 and the first signal 62 and a difference (delta) signal 72 from the intermediate signal 68 and the first signal 62. These new sigma and delta signals 70, 72 are amplified by power amplifiers to a desired output level before having two signals reconstructed from the amplified sigma and amplified delta signals by a sigma-delta circuit. These reconstructed signals have the data of the original first signal 62, but are at a desired amplified level for transmit diversity. The reconstructed signals are then transmitted through respective antennas as uplink signals. By employing this uplink MIMO transmitter apparatus, it is possible to use smaller power amplifiers, which may reduce footprint, power consumption, and costs of the uplink MIMO transmitter apparatus. Likewise, it is possible to use a single ETIC having a single control signal to control both power amplifiers, further simplifying the transmitter apparatus.

One exemplary transmitter apparatus 80 according to the present disclosure is illustrated in FIG. 3. The transmitter apparatus 80 is configured to amplify using a power amplifier circuit 82, a sigma signal 70 and a delta signal 72. The output of the power amplifier circuit 82 is provided to a sigma-delta circuit 84 that uses summation circuitry 86 to provide an amplified signal 90, which corresponds to an amplified version of a first input signal 92. The sigma-delta circuit 84 also uses difference circuitry 88 to provide an amplified signal 94, which corresponds to an amplified version of a second input signal 96. Amplified signals 90 and 94 are provided to antennas 98 and 100, respectively, through the transmit filters 38, 40, impedance tuners 42, 44, and flex line connections 46 and 48 as previously described. Termination circuits 50 and 52 may likewise be provided as previously described.

The transmitter apparatus 80 includes a transceiver circuit 102 that includes an internal sigma-delta circuit 104 configured to receive the first input signal 92 and the second input signal 96. The second input signal 96 is the first input signal 92 phase shifted by 90 degrees by phase shift circuit 106 and is a' as explained relative to FIG. 2. Thus, the first input signal 92 and the second input signal 96 are orthogonal to one another. The first input signal 92 and the second input signal 96 are summed by summation circuitry 108 in the sigma-delta circuit 104 to form the signal 70. The first input signal 92 and the second input signal 96 are subtracted from one another by difference circuitry 110 in the sigma-delta circuit 104 to form the signal 72.

By amplifying the sigma signal (i.e., a+a') and the delta signal (i.e., a−a'), and then recombining the amplified signals through the second sigma-delta circuit 84, the requirements on the power amplifiers is lessened such that the power amplifiers now only need be capable of supporting half peak power. This reduced requirement allows the size of the power amplifier to be reduced, which in turn reduces space utilization and cost. While there is some offsetting space loss by the use of the sigma-delta circuits, there is a net space savings.

The power amplifier circuit 82 is controlled by two signals (Vcc$\Sigma$ and Vcc$\Delta$) from an ETIC 110, which receives two control signals (Vramp$\Sigma$ and Vramp$\Delta$) from the transceiver circuit 102.

Figure 4:
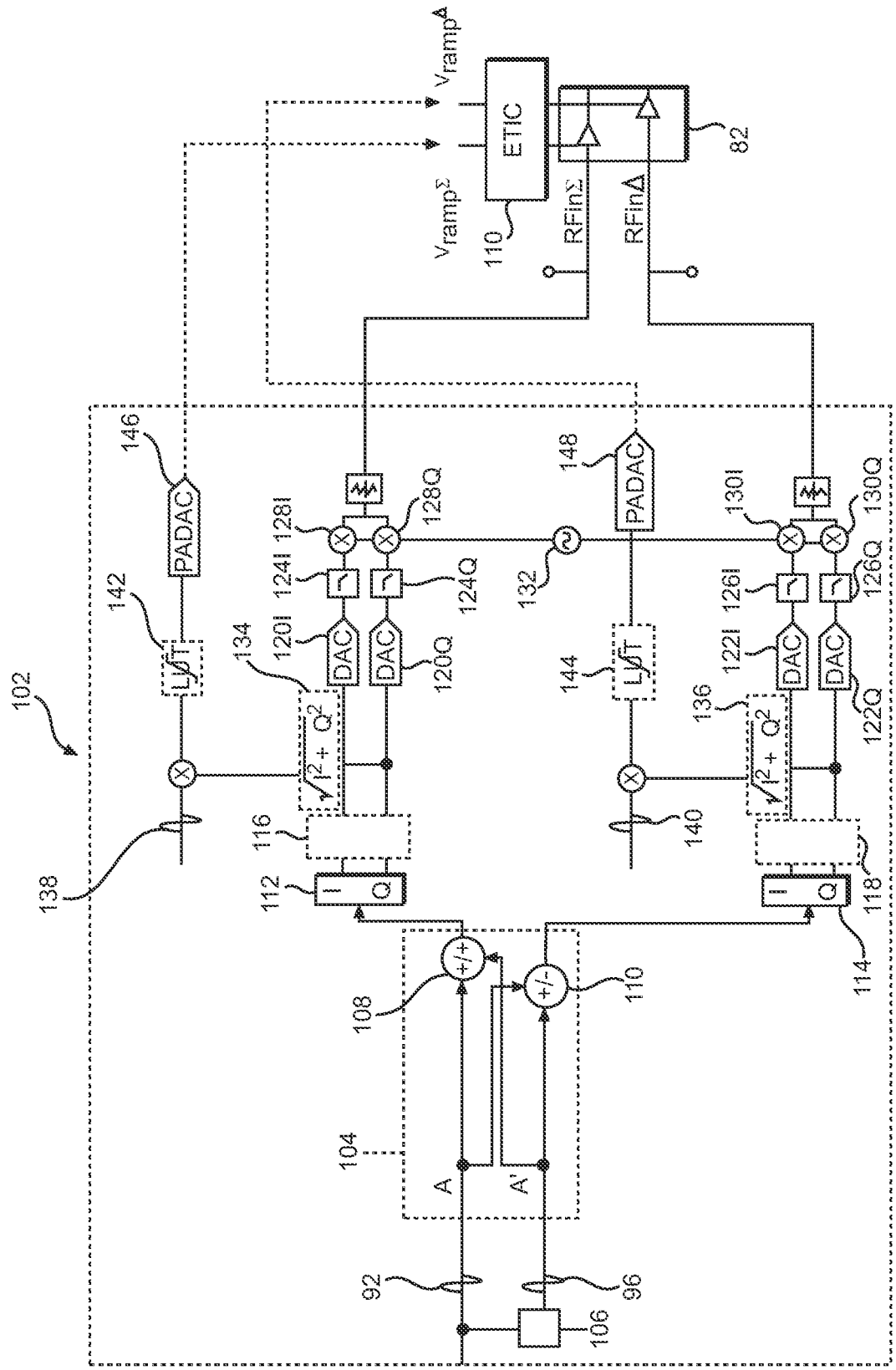
FIG. 4 is a schematic diagram of the details of the transceiver circuit of FIG. 3.

The transceiver circuit 102 is better illustrated FIG. 4. As noted with reference to FIG. 3, the transceiver circuit 102 starts with the first input signal 92 (A) and creates the second input signal 96 (A') that is orthogonal in nature by phase shifting the first input signal 92 by 90 degrees with the phase shift circuit 106. The two signals 92, 96 may start at a baseband frequency and are summed by the summation circuitry 108 to create a sigma signal (A+A'). The two signals are likewise manipulated by the difference circuitry 110 to create a delta signal (A−A'). The sigma and delta signals are then converted to complex form by generating an In-Phase (I) and Quadrature Phase (Q) component by circuits 112, 114, respectively. Digital pre-distortion (DPD) is applied by DPD circuits 116, 118, respectively. This pre-distortion inside the transceiver circuit 102 allows cross-DPD to cancel or reduce cross-intermodulation components (e.g., IMIm,n and ImQm,n) as needed or desired. The outputs of the DPD circuits 116, 118 are converted to an analog form by digital-to-analog converters (DACs) 120I, 120Q, 122I, and 122Q before filtering by filters 124I, 124Q, 126I, and 126Q. The filtered signals are upconverted to an RF frequency by mixers 128I, 128Q, 130I, and 130Q using a signal from an oscillator 132 before being recombined and sent to the power amplifier circuit 82 (FIG. 3).

The control signals for the ETIC 110 are derived by finding an amplitude of an envelope by taking the square root of the difference of squares of the I and Q components. That is, circuits 134, 136 calculate the envelope as follows:

$$\sqrt[2]{I^2 + Q^2}.$$

The amplitude of the envelope is multiplied by respective gain input scaling terms 138, 140 (sometimes referred to as gain_scale) and passed to a look-up table (LUT) 142, 144. The output of the LUT 142, 144 is passed to a DAC 146, 148, to generate Vramp$\Sigma$ and Vramp$\Delta$ which are used by the ETIC 110.

Figure 5:
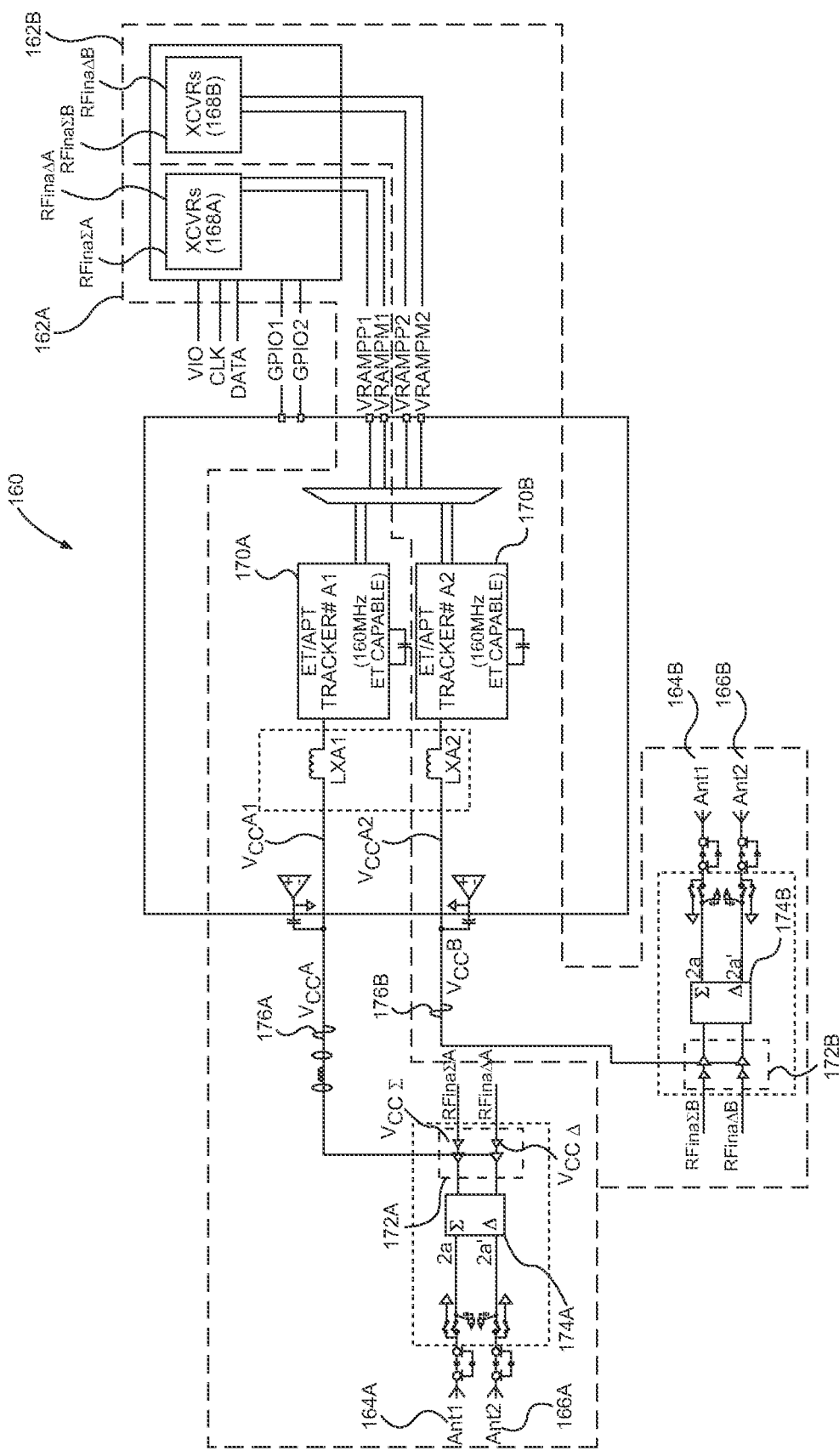
FIG. 5 is a schematic diagram of two transmitter chains operating with a single envelope tracking integrated circuit (ETIC) to provide diversity signals to different antenna pairs.
Figure 6:
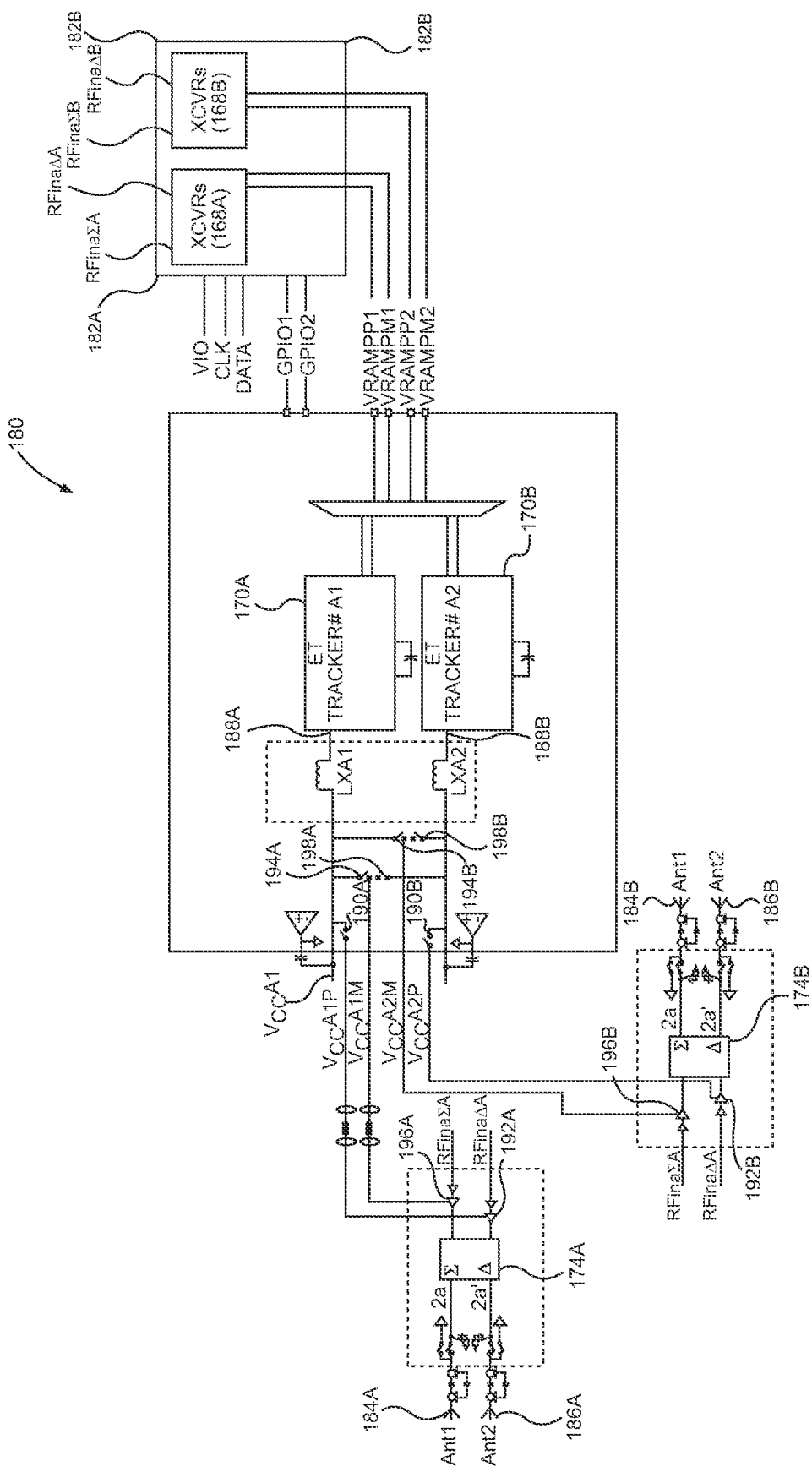
FIG. 6 is a schematic diagram of an alternate aspect of two transmitter chains operating with a single ETIC to provide diversity signals to different antenna pairs.

FIGS. 5 and 6 show possible use cases with multiple antenna sets. In particular, FIG. 5 shows a mobile computing device 160 that may have two transmitter apparatuses 162A, 162B therein. The two transmitter apparatuses 162A, 162B may each use transmit diversity for respective antennas 164A, 166A, 164B, and 166B. For example, antennas 164A, 166A may be on an "upper" side of the mobile computing device 160 and thus may also be referred to as UAT (upper antenna) and antennas 164B, 166B may be on a "lower" side of the mobile computing device 160 and thus may also be referred to as LAT (lower antenna). Each transmitter apparatus 162A, 162B may be essentially identical to the transmitter apparatus 80 of FIG. 3 with transceiver circuits 168A, 168B essentially identical to the transceiver circuit 102 of FIG. 4. The transceiver circuit 168A supplies control signals to ETIC 170A while the transceiver circuit 168B supplies control signals to ETIC 170B. Likewise, the transceiver circuit 168A generates RFin$\Sigma$A, RFin$\Delta$A, and the transceiver circuit 168B generates RFin$\Sigma$B and RFin$\Delta$B. The signals RFin$\Sigma$A, RFin$\Delta$A, RFin$\Sigma$B and RFin$\Delta$B are passed to amplifier networks 172A and 172B, respectively. After amplification, the signals are passed to second sigma-delta circuits 174A, 174B, respectively for transmission through the antennas 164A, 164B, 166A, 166B. Note that the amplifier network 172A receives just a single VccA signal 176A and the amplifier network 172B receives just a single VccB signal 176B. The mobile computing device 160 may support 2×2 MIMO transmit diversity with just two ETIC circuits and with smaller power amplifiers than conventional systems.

Similarly, FIG. 6 shows a mobile computing device 180 that is similar to the mobile computing device 160 of FIG. 5 in that there are two transmitter apparatuses 182A, 182B serving antennas 184A, 186A, 184B, and 186B, respectively. Many elements of the mobile computing device 180 are identical to those in the mobile computing device 160 and are presented with the same numbers without repeating the discussion of the elements. However, in addition to 2×2 transmit diversity being possible on the two transmitter apparatuses 182A, 182B, the mobile computing device 180 also allows for up to four different voltages to be supplied to the power amplifier networks 172A, 172B without requiring four ETICs, which in turn allows for 2×2 MIMO with different data streams without transmit diversity or 2×2 MIMO with two-antenna transmit diversity for each channel.

In particular, switches are provided for outputs 188A, 188B of the ETICs 170A, 170B. First switch 190A, 190B selectively couples a first power amplifier 192A, 192B in the power amplifier networks 172A, 172B, respectively, to the ETICs 170A, 170B. Second switch 194A, 194B selectively couples a second power amplifier 196A, 196B in the power amplifier networks 172A, 172B, respectively, to the ETICs 170A, 170B. Third switch 198A, 198B selectively couples the second power amplifier 196A, 196B to the opposite ETIC 170B, 170A.

Thus, if first and second switches 190A, 190B, 194A, 194B are closed and third switches 198A, 198B are open, then VccA is provided to both power amplifiers 192A and 196A while VccB is provided to both power amplifiers 192B and 196B. This arrangement makes the mobile computing device 180 function identically to the mobile computing device 160. However, if the first and third switches 190A, 190B, 198A, 198B are closed and the second switches 194A, 194B are open, VccA is provided to the power amplifiers 192A, 192B and VccB is provided to the power amplifiers 196A, 196B.

Those skilled in the art will recognize improvements and modifications to the preferred embodiments of the present disclosure. All such improvements and modifications are considered within the scope of the concepts disclosed herein and the claims that follow.

What is claimed is:

1. A transmitter apparatus comprising:
   a transceiver circuit comprising:
      a phase-shifting circuit configured to shift a first signal by ninety degrees to create a second signal orthogonal to the first signal; and
      a first sigma-delta network comprising:
         an input configured to receive the first signal and the second signal;
         first summation circuitry configured to sum the first signal with the second signal to create a sigma signal;
         first difference circuitry configured to subtract the second signal from the first signal to create a delta signal;
         a sigma output coupled to the first summation circuitry; and
         a delta output coupled to the first difference circuitry;
   a first power amplifier coupled to the sigma output, the first power amplifier comprising a summed output; and
   a second power amplifier coupled to the delta output, the second power amplifier comprising a difference output.

2. The transmitter apparatus of claim 1, further comprising:
   a second sigma-delta network comprising:
      a summed input coupled to the summed output and configured to receive an amplified sigma signal;
      a difference input coupled to the difference output and configured to receive an amplified delta signal;
      second summation circuitry configured to sum the amplified sigma signal and the amplified delta signal to create an amplified first signal;
      second difference circuitry configured to subtract the amplified delta signal from the amplified sigma signal to create an amplified second signal;
      a first output coupled to the second summation circuitry; and
      a second output coupled to the second difference circuitry.

3. The transmitter apparatus of claim 2, further comprising a first antenna coupled to the first output and a second antenna coupled to the second output.

4. The transmitter apparatus of claim 3, further comprising a first impedance tuner coupled to the first antenna and the first output.

5. The transmitter apparatus of claim 4, further comprising a filter coupled to the first impedance tuner and the first output.

6. The transmitter apparatus of claim 1, further comprising an envelope tracking integrated circuit (ETIC) coupled to the transceiver circuit and configured to receive control signals from the transceiver circuit.

7. The transmitter apparatus of claim 6, wherein the ETIC is coupled to the first and second power amplifiers and controls the first and second power amplifiers based on the control signals.

8. The transmitter apparatus of claim 6, further comprising a first switch positioned between the ETIC and the first power amplifier.

9. The transmitter apparatus of claim 8, further comprising a second switch positioned between the ETIC and the second power amplifier.

10. The transmitter apparatus of claim 9, further comprising a third switch positioned between the ETIC and a third power amplifier.

11. The transmitter apparatus of claim 6, further comprising a second ETIC and a second transceiver circuit.

12. A transmitter apparatus comprising:
   a first transceiver circuit comprising:
      a first phase-shifting circuit configured to shift a first signal by ninety degrees to create a second signal orthogonal to the first signal; and
      a first sigma-delta network comprising:
         an input configured to receive the first signal and the second signal;
         first summation circuitry configured to sum the first signal with the second signal to create a sigma signal;
         first difference circuitry configured to subtract the second signal from the first signal to create a delta signal;
         a first sigma output coupled to the first summation circuitry; and
         a first delta output coupled to the first difference circuitry;
   a first power amplifier coupled to the first sigma output, the first power amplifier comprising a first summed output; and
   a second power amplifier coupled to the first delta output, the second power amplifier comprising a first difference output; and
   a second transceiver circuit comprising:
      a second phase-shifting circuit configured to shift a third signal by ninety degrees to create a fourth signal orthogonal to the third signal; and
      a second sigma-delta network comprising:
         a second input configured to receive the third signal and the fourth signal;
         second summation circuitry configured to sum the third signal with the fourth signal to create a second sigma signal;
         second difference circuitry configured to subtract the fourth signal from the third signal to create a second delta signal;
         a second sigma output coupled to the second summation circuitry; and a second delta output coupled to the second difference circuitry;
a third power amplifier coupled to the second sigma output, the third power amplifier comprising a second summed output; and
a fourth power amplifier coupled to the second delta output, the fourth power amplifier comprising a second difference output.

13. The transmitter apparatus of claim 12, further comprising:
a first envelope tracking integrated circuit (ETIC) coupled to the first transceiver circuit and configured to receive first control signals from the first transceiver circuit; and
a second ETIC coupled to the second transceiver circuit and configured to receive second control signals from the second transceiver circuit.

14. The transmitter apparatus of claim 13, wherein the first ETIC is coupled to the first and second power amplifiers and controls the first and second power amplifiers based on the first control signals.

15. The transmitter apparatus of claim 14, further comprising a first switch positioned between the first ETIC and the first power amplifier.

16. The transmitter apparatus of claim 15, further comprising a second switch positioned between the first ETIC and the second power amplifier.

17. The transmitter apparatus of claim 16, further comprising a third switch positioned between the first ETIC and the third power amplifier.

* * * * *

UNITED STATES PATENT AND TRADEMARK OFFICE
CERTIFICATE OF CORRECTION

PATENT NO. : 11,336,240 B2
APPLICATION NO. : 17/149917
DATED : May 17, 2022
INVENTOR(S) : Nadim Khlat It is certified that error appears in the above-identified patent and that said Letters Patent is hereby corrected as shown below:

In the Specification

Column 3, Line 26, replace "diversity signal aa" with --diversity signal αa--.
Column 6, Line 39, replace "sometimes referred to as signal aa" with --sometimes referred to as signal αa--.
Column 7, Line 67, replace "digital-to-analog converters (DACs) 1201" with --digital-to-analog converters (DACs) 120I--.
Column 8, Lines 1-3, replace "120Q, 1221, and 122Q before filtering by filters 1241, 124Q, 1261, and 126Q. The filtered signals are upconverted to an RF frequency by mixers 1281, 128Q, 1301, and 130Q" with --120Q, 122I, and 122Q before filtering by filters 124I, 124Q, 126I, and 126Q. The filtered signals are upconverted to an RF frequency by mixers 128I, 128Q, 130I, and 130Q--.

Signed and Sealed this
Twenty-eighth Day of June, 2022

Katherine Kelly Vidal
*Director of the United States Patent and Trademark Office*